LOW LEVEL, LOW OFFSET, HIGH FREQUENCY
PREAMPLIFIER CHOPPER CIRCUIT
Filed April 22, 1968

INVENTORS
JAMES P. TOWEY
RICHARD F. LACH
JOHN E. GAMES
BY Melvin Pearson Williams
ATTORNEY

United States Patent Office 3,518,564
Patented June 30, 1970

3,518,564
LOW LEVEL, LOW OFFSET, HIGH FREQUENCY PREAMPLIFIER CHOPPER CIRCUIT

John E. Games, Granby, Richard F. Lach, Hartford, and James P. Towey, Stafford Springs, Conn., assignors to United Aircraft Corporation, East Hartford, Conn., a corporation of Delaware Filed Apr. 22, 1968, Ser. No. 723,043
Int. Cl. H03f 3/38, 3/00
U.S. Cl. 330—10 1 Claim

ABSTRACT OF THE DISCLOSURE

A DC chopper input to an AC differential amplifier utilizes a double emitter solid state switch in which each of the differential inputs is connected to a corresponding emitter of the switch, the switch shorting the inputs together in a differential fashion. The differential amplifier includes balanced AC input impedance for maximum common mode rejection as well as feedback amplitude limiting clamping means. The circuit can be driven from any suitable AC source over a wide range of frequencies, even in the order of magnitude of 10 kh.

BACKGROUND OF THE INVENTION

Field of the invention

This invention relates to AC differential amplification of DC signals, and more particularly to a differential chopper input circuit and circuitry related therewith.

Description of the prior art

It is well known that the use of DC amplifiers to amplify DC signals is unsatisfactory in many applications particularly where low level DC signals are employed. This is due to the fact that DC amplifiers cannot be compensated adequately with respect to drift over a period of time or to drift as a result of temperature variation. As a result, many configurations of AC amplifiers fed by DC signal responsive modulators (commonly referred to as choppers) have been developed. Many of these are differential in nature and many are single-ended. Recent advances in chopper input circuitry have included solid state switching devices with isolation transformers for separation of chopper control potential from the signals being controlled thereby. Many alleged differential configurations have been proposed; however, those available in the prior art art not truly differential in that internally generated noise does not appear as a common mode signal and is therefore not cancelled at the input to the amplifier. Thus, the lack of a true differential configuration results in only partial rejection which in turn provides output voltage offset variations due to changes in switching transients as a function of circuit parameter and temperature variations.

Additionally, devices known heretofore have been unduly complex, which results in cost increases as well as size limitations that severely hamper packaging of useful apparatus. Further, the more apparatus required, the more capacitance is induced into the system and therefore, the more is the desired effect of the chopper amplifier mitigated due to real-circuit design problems which result in uncancelled internally generated noise, such as switching transients. Specifically, the utilization of isolation transformers requires the transformers be discretely disposed adjacent switching devices in order to minimize stray capacitance coupling.

Another problem is that the components required for prior art choppers are not capable of implementation in solid circuitry technology, and, therefore, preclude maximizing the low cost, compact, and low capacitance characteristics of solid state technology.

SUMMARY OF THE INVENTION

The principle object of the present invention is to provide an improved DC responsive chopper input for for a chopper amplifier. Other objects include provision of maximum temperature stability in a DC chopper amplifier; maximum cancellation of internal noise; and a chopper capable of implementation and solid logic technology, capable of operation over a wide variation of control signal wave shapes and frequencies, and capable of implementation with capacitors of minimal size.

In accordance with the present invention, the input to a differential amplifier are chopped line-to-line by a solid state switch. In further accord with the present invention, the chopper switch is driven with a non-isolated chopper excitation signal. According still further to the present invention, a multi-element solid state device with low offset between current conducting elements is utilized to chop the input to a differential amplifier line-to-line. In accordance with further aspects of the present invention, a combined double-ended or single-ended differential amplifier chopper input is provided.

In further accord with the present invention, a bistable switching device is utilized to drive both the input chopper and the output demodulator, the switching device being operable in response to a wide variation of signal sources. This provides noise isolation which in turn permits utilization of low quality time varying signals, such as AC power supply potentials.

According to the teachings of the present invention, extremely high temperature stability is inherent in the device itself, thus overcoming the need for any external temperature bias and providing improved overall circuit operation. Because of a maximum cancellation of internally generated noise, which noise becomes intolerable at higher frequencies, the present invention permits use of much higher switching speeds since all internally generated noise is cancelled due to the excellent common mode rejection characteristics hereof. This is true whether the circuit is connected for a double-ended input or a single-ended input, even with one of the inputs connected ground (this is true only of internal but not external noise). In other words, the present invention provides the same common mode rejection for internally generated noise in either a single-ended input (even with one terminal grounded) or the double-ended differential input. In addition, since no inductive elements are utilized, the transient response characteristics of a chopper in accordance herewith permits utilization of much higher switching speeds as well. Thus, switching frequencies as high as 10 kh. have been successfully utilized in a circuit practicing the present invention.

Other objects, features and advantages of the present invention will become more apparent in the light of the following detailed description of a preferred embodiment thereof, as illustrated in the accompanying drawing.

DESCRIPTION OF THE PREFERRED EMBODIMENT

Figure 1:
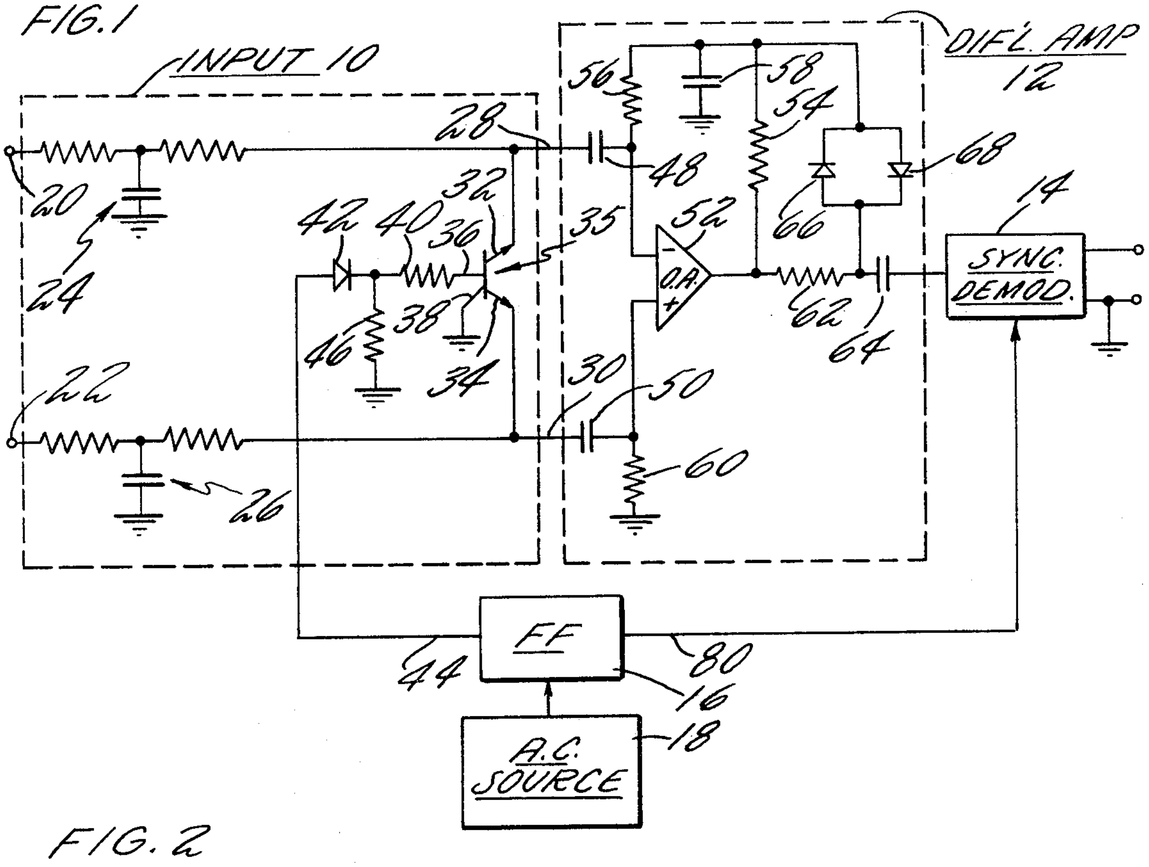
FIG. 1 is a schematic block diagram of a preferred embodiment of the present invention.

Referring now to FIG. 1, an input chopper circuit 10 feeds a differential amplifier 12, the output of which feeds a sychronous demodulator 14 of a well known type. Both the input 10 and the synchronous demodulator 14 are controlled by complementary phases of a flip-flop 16, which in turn is driven by any suitable AC source 18, as is described more fully hereafter. A DC signal to be amplified may be fed to a pair of terminals 20, 22, each of which is connected to a respective input filter network 24, 26, which attenuate internally generated noise which tends to be fed back from the amplifier input through the input 20, 22 to the source of signal being amplified.

Each of a pair of input lines 28, 30 to the differential amplifier is connected to a respective emitter 32, 34 of a double emitter solid state switch 35, which may be of the type sometimes referred to in the marketplace as an integrated chopper, or "INCH." This is essentially a double emitter transistor having a single base 36 and a single collector 38, the control current on the base controlling the flow of current between the emitters 32, 34. This structure, however, differs from analogous operation of regular transistors in that the control current flows in the base collector circuit, whereas the controlled current flows from emitter to emitter. The operation of this form of double emitter solid state switching apparatus is described more fully in a variety of handbooks available to the public. The base 36 of the solid state switch 35 is connected to a resistor 40 and a diode 42 to one output 44 of the complementary flip-flop circuit 16. The junction between the resistor 40 and diode 42 is connected through an additional resistor 46 to ground. The purpose of the network 40, 42, 46 is to block the low voltage signal (that is when the output 44 is off), and to provide a low impedance circuit to ground through the resistors 40, 46 during this time for shunting of leakage currents to the base 36. This type of drive circuit and other suitable drive arrangements are well known to those skilled in the art, and will not be amplified herein. Each of the inputs 28, 30 of the differential amplifier 12 is fed through a related coupling capacitor 48, 50 which provide decoupling of the input from drift currents in the operational amplifier 52 which provides the amplification function within the differential amplifier 12. The output of the differential amplifier is fed back through a resistor 54 to an input resistor 56 to provide stable, low-gain operation of the operational amplifier for DC signals. The junction of the resistor 54, 56 is AC coupled to ground through a coupling capacitor 58 which thus maintains the junction of resistors 54, 56 at ground relative to AC signals, thus providing a balanced AC input impedance to the operational amplifier 52 along with the input resistor 60 of the positive input to the amplifier. Because of the shunting effect of the capacitor 58, the operational amplifier 52 has high open loop gain to AC signals. In the output of the operational amplifier 52, a resistor 62 limits the current which can flow through an output coupling capacitor 64 which feeds the synchronous demodulator 14. At the junction of the resistor and capacitor 62, 64 a pair of diodes limit the output of the differential amplifier 12 to a low level to prevent transients or other peak signals from latching the operational amplifier 52 into a saturated mode. In this respect, the utilization of the clamping diodes 66, 68 necessarily will limit the utilization of the differential amplifier 12 to use as a preamplifier; however, if desired, the configuration of the differential amplifier 12 may be altered suitably so as to suit any particular implementation of the present invention.

Figure 4:
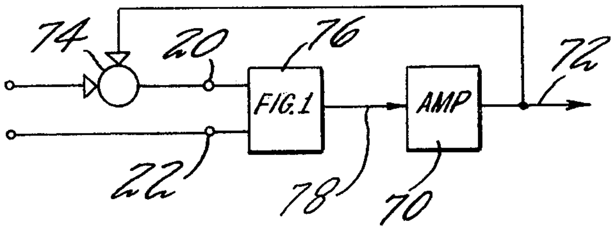
FIG. 4 is a block diagram of a circuit incorporating the embodiment of FIG. 1.

Thus, the circuit as shown in FIG. 1 may be most advantageously used in conjunction with an amplifier 70 as shown in FIG. 4. The output 72 is fed back to a summing network 74 for summation with either a single-ended input signal or one half of a double-ended input signal, for application to the input terminal 20 of the differential amplifier chopper amplifier 76, which comprises the entire circuitry of FIG. 1. When so operated, the differential amplifier 12 (within the amplifier 76 of FIG. 4) is operated essentially with full open loop gain to AC signals, and a balanced "AC" input impedance, thus providing maximum common mode rejection of switching transients, but the feedback of the amplifier 70 to the input of the chopper amplifier 76 controls the closed loop gain of the amplifier so that amplification is not temperature responsive. The DC drift of amplifier 70 when referred to the input 78 of the amplifier 70 is divided by the open loop gain characteristic of the amplifier 76, as is well known in the amplifying art. Thus, the open loop AC gain characteristic of the differential amplifier 12 (within amplifier 76 in FIG. 4) which provides for maximum common mode rejection in the chopper amplifier 76 is compensated for in the overall circuit configuration by feedback from amplifier 70 to the input of the chopper amplifier 76.

The synchronous demodulator 14 is connected to the complementary output 80 of the flip-flop 16. Thus, the synchronous demodulator 14 is operated out of phase with the chopper switch 35, as is well known in the chopper amplifier art. The nature of the synchronous demodulator is not germain to the present invention, and any one of a number of solid state synchronous demodulators may be employed therein.

In operation, DC signals applied to the input terminal 20, 22 and passed through the filter 24, 26 appear at the inputs 28, 30 of the differential amplifier 12. Whenever the signal at the output 44 of flip-flop 16 is positive, diode 42 conducts, and causes the base 36 of the switch 35 to become positive, thus giving rise to a current flow between the base 36 and the collector 38. This results in conduction between the emitters 32, 34 of the switch 35, thereby almost completely shorting the inputs 28, 30 together. As a matter of fact, integrated chopper switching devices are available which have an offset voltage between the emitters 32, 34 on the order of magnitude of 50 microvolts. In addition, the impedance between the emitters 32, 34 is negligible with respect to the circuit input impedance (which is essentially the impedance of the input filters 24, 26). This impedance may be on the order of magnitude of 15 ohms, and therefore represents substantially a short circuit with respect to the input to the operational amplifier 52. It is to be noted that the chopping takes place between the emitters 32, 34, the current flow not being through each emitter from ground as is true in the usual solid state chopper circuit. Thus, the present invention provides true line-to-line chopping (subject only to the internal emitter-to-emitter impedance during the on-time of the switch 35). When the output terminal 44 of flip-flop 16 is no longer positive, the diode 42 will not conduct and thus isolates the flip-flop 16 from the chopper switch 35. The base 36 therefore drops below the threshold potential with respect to the collector 38 and the conduction between the emitters 32, 34 ceases. At this time, the impedance between the collectors 32, 34 is substantially an open circuit; more significant, however, any leakage current which does flow between the emitters 32, 34 has negligible effect to the overall circuit since it is cancelled differentially due to the symmetry of the input network 24, 26. In other words, relative to circuit operation, the switching device 35 represents an open circuit during its nonconducting periods.

Figure 2:
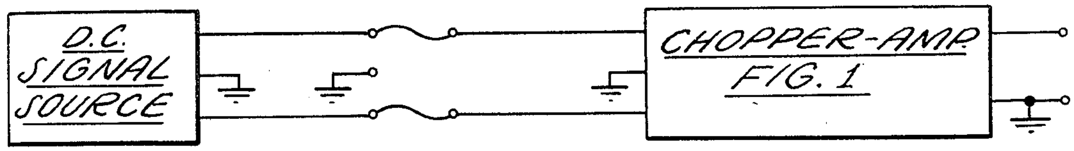
FIG. 2 is a simplified schematic block diagram of a chopper amplifier connected in a double-ended mode to a DC signal source.
Figure 3:
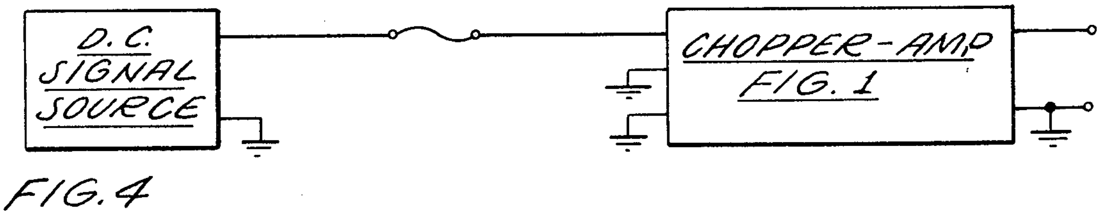
FIG. 3 is a simplified schematic diagram of a chopper amplifier connected in a single-ended mode to a DC signal source.

One of the features of the present invention is that it operates in a low offset, high common mode rejection fashion even with single ended inputs applied thereto, and even with one of the input terminals 20, 22 connected to ground. Consider as an example connecting input 22 to ground and connecting a single input to the terminal 20, as shown in FIG. 2. With input terminal 22 grounded, it is at the same potential as the collector 38 of the switch 35. However, chopping is not now from line 28 to ground but rather from line 28 to line 30 as described hereinbefore. This is possible because of the impedance of the filter networks 24, 26 which effectively isolate either points 28, 30 from being at the same potential as the inputs 20 or 22, when grounded. This isolation allows internally generated switching noise to appear as a common mode signal on lines 28 and 30, and consequently be rejected by differential amplifier 12. Thus line-to-line chopping can be maintained even with one of the input line terminals grounded. When operating in this mode, the operation is the same as with differential inputs, and full common mode rejection of internally generated noise is achieved in the same fashion with single-ended inputs as it is with true double-ended differential input signals.

The utilization of the flip-flop 16 permits a wide choice in the characteristics of the AC source 18. Since the flip-flop 16 generates its own output signals, and isolates its outputs 44, 80 from its input, the noise of the AC source 18 is limited only by the input tolerance of the flip-flop 16, and not by the low level input signal characteristics of the chopper amplifier. As is known in the art, the noise immunity of flip-flops can be substantially higher than low level DC signals, the amplification of, which is the purpose of chopper amplifiers. In other words, the flip-flop can tolerate noise and isolate noise from the chopper amplifier circuit, thus permitting use of noisy AC sources.

Because the input to the operational amplifier 52 is substantially differential in nature, the rejection of internally generated noise, and particularly AC transients resulting from switching of the chopper, is substantially complete due to cancellation as a result of the symmetry of the input signals to the operational amplifiers 52. For this reason, variations in AC transients (resulting from variations in capacitance, as well as in other circuit component parameters, as a function of temperature variations) are minimized in accordance with the present invention. Also, the high common mode rejection characteristic of the present invention minimizes the effect of very high frequency switching signals so that the frequency of the AC source 18 may be in excess of 10 kHz. without providing any significant output voltage offset as a result of temperature variations or other drift. Because a very high frequency source 18 may be utilized, the size of the capacitors required for filtering (such as the filter networks 24, 26) and for coupling (such as the coupling capacitors 48, 50) and for other functions in the circuit may be much smaller than is required at switching speeds tolerable by chopper amplifiers known in the prior art. This in turn renders a chopper amplifier in accordance with the present invention capable of being readily implemented in solid technology, whether of the monolithic or hybrid form.

Although the invention has been shown and described with respect to a preferred embodiment thereof, it should be obvious to those skilled in the art that the foregoing and various other changes and omissions in the form and detail thereof may be made therein without departing from the spirit and scope of the invention.

Having thus described a typical embodiment of our invention, that which we claim as new and desire to secure by Letters Patent of the United States is:

1. A chopper amplifier comprising:

a differential amplifier having a pair of inputs, the output of said amplifier being a function of the difference between signals supplied to respective ones of said inputs;

a source of control signals alternating between opposite ones of two polarities;

a double emitter integrated chopper solid state switching device having a base and a collector, each emitter of said device connected to a respective one of said inputs, said collector connected to ground, said base being operative in response to a signal of a first one of said polarities to cause a substantial conductance between the two emitters of said device;

and unilaterally conducting means connecting said source to said base and poled to conduct control signals of said first polarity to said base, said device thereby alternating between substantial conductance and substantial non-conductance in response to said control signals.

References Cited

UNITED STATES PATENTS

| | | | |
|---|---|---|---|
| 3,317,758 | 5/1967 | Nazareth et al. ------ | 307—240 |
| 3,408,542 | 10/1968 | Devtzenberg et al. -- | 307—240 X |

OTHER REFERENCES

Mitchell and Bell: "The Inch," discussion and application, Solid State Design, October 1962, pp. 34–42, National Semiconductor Corp., Danbury Conn.

NATHAN KAUFMAN, Primary Examiner

U.S. Cl. X.R.

330—16, 24